(12) United States Patent
Lo

(10) Patent No.: US 6,806,154 B1
(45) Date of Patent: Oct. 19, 2004

(54) METHOD FOR FORMING A SALICIDED MOSFET STRUCTURE WITH TUNABLE OXYNITRIDE SPACER

(75) Inventor: Guo-Qiang Patrick Lo, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/169,303

(22) Filed: Oct. 8, 1998

(51) Int. Cl.⁷ .................................. H01L 21/336
(52) U.S. Cl. ................. 438/303; 438/197; 438/585; 438/595; 438/655
(58) Field of Search ................. 438/302, 305, 438/592, 655, 197, 199, 229, 230, 299, 301, 303, 306, 307, 585, 595, 652, 656; 257/336, 408

(56) References Cited

U.S. PATENT DOCUMENTS

| | | | |
|---|---|---|---|
| 3,558,348 A | 1/1971 | Rand | 117/106 |
| 4,702,936 A | 10/1987 | Maeda et al. | 427/54.1 |
| 4,837,185 A | 6/1989 | Yau et al. | 437/228 |
| 4,954,867 A * | 9/1990 | Hosaka | 357/52 |
| 5,260,236 A | 11/1993 | Petro et al. | 437/241 |
| 5,362,686 A | 11/1994 | Harada | 437/238 |
| 5,439,846 A | 8/1995 | Nguyen et al. | 437/187 |
| 5,451,546 A | 9/1995 | Grubisich et al. | 437/200 |
| 5,472,890 A | 12/1995 | Oda | 437/41 |
| 5,573,965 A * | 11/1996 | Chen et al. | 438/297 |
| 5,587,344 A | 12/1996 | Ishikawa | 437/238 |
| 5,591,494 A | 1/1997 | Sato et al. | 427/579 |
| 5,604,157 A * | 2/1997 | Dai et al. | 438/301 |
| 5,707,898 A | 1/1998 | Keller et al. | 438/265 |
| 5,731,239 A | 3/1998 | Wong et al. | 438/296 |
| 5,824,588 A * | 10/1998 | Liu | 438/302 |
| 5,872,063 A * | 2/1999 | Chao et al. | 438/762 |
| 5,872,385 A * | 2/1999 | Taft et al. | 257/437 |
| 5,891,784 A * | 4/1999 | Cheung et al. | 438/303 |
| 5,902,125 A * | 5/1999 | Wu | 438/300 |
| 5,930,627 A * | 7/1999 | Zhou et al. | 438/257 |
| 6,013,570 A * | 1/2000 | Yu et al. | 438/595 |
| 6,489,209 B1 * | 12/2002 | Shimoji | 438/305 |

* cited by examiner

Primary Examiner—Jack Chen
(74) Attorney, Agent, or Firm—Victor H. Okumoto, Esq.

(57) ABSTRACT

A method for fabricating a MOSFET structure is disclosed. A coating is provided on the upper surface of a gate. Thereafter doped regions are implanted into the substrate. A layer is provided over the MOSFET structure and etched to form spacers. The MOSFET structure is reacted with salicide-forming reactant to produce a salicide MOSFET.

21 Claims, 2 Drawing Sheets

METHOD FOR FORMING A SALICIDED MOSFET STRUCTURE WITH TUNABLE OXYNITRIDE SPACER

BACKGROUND OF THE INVENTION

1. Field of the Invention

The invention relates generally to the field of microelectronic fabrication. More particularly, the invention relates to a salicided metal oxide silicon field effect transistor (MOSFET) structure with a tunable oxynitride ($SiN_xO_y$) spacer.

2. Discussion of the Related Art

Prior art MOSFETs are known to those skilled in the art. In the case of deep sub ¼ micron salicided MOSFETs, oxynitride anti-reflective coatings have been used on top of the polycrystalline silicon layers for advanced lithography processes (e.g., such as deep ultra-violet, DUV). In more detail, a polycrystalline silicon layer that will be patterned to define the gates of the MOSFETs is covered with the oxynitride anti-reflective coating. The anti-reflective coating is then covered with a photoresist. The anti-reflective coating improves the resolution of the photo lithographic process. After the photoresist is developed, the exposed portions of the anti-reflective coating, and subsequently, the exposed portions of the polycrystalline silicon will be (plasma) dry-etched away. After the polycrystalline silicon layer is patterned to define the gates, $N^-/P^-$ source and drain regions are formed in the exposed underlying silicon substrate. An oxide layer is then deposited and anisotropically etched to form spacers adjacent the patterned gates. This is followed by $N^+/P^+$ source and drain region formation, and then HF cleaning. A metal layer is then deposited on polycrystalline (gate) and silicon (source/drain) areas and heated, thereby causing portions of the metal layer that are in contact with underlying silicon structures to react with the silicon in those structures to form salicide (self aligned silicide). Those portions of the metal layer that are in contact with the oxide spacers do not react to from a salicede. This is how the silicide is self aligned between the gate and the source/drain.

A problem with this technology has been that the oxide spacers are attacked by the HF cleaning before the metal layer can be deposited. The HF cleaning is a necessary step to remove native oxide. Native oxide will retard or even prohibit the metal/Si reaction and will result in both a high junction resistance and leakage. When the oxide spacers are attacked by the HF cleaning, the accuracy (resolution) of the photo lithographic process can suffer. In to more detail, prolonged HF cleaning can erode the oxide spacers, thereby exposing the lightly doped junction area underneath the original spacer area. The extent of the area of lightly doped junction that is exposed depends on the duration of the HF cleaning which determines how much of the spacer material is eroded from the exposed sides.

One unsatisfactory approach, in an attempt to solve the loss of accuracy problem involves forming the spacers from silicon nitride. Silicon nitride is resistant to HF. However, the dielectric constant of silicon nitride is high and this approach increases the fringing capacitance of the resulting MOSFET, which degrades the device dynamic (speed) performance. Therefore, what is required is an HF resistant spacer that does not degrade the device dynamic performance.

Another problem with both the silicon oxide spacer and silicon nitride spacer approaches is that the use of either of these materials creates a process incompatibility with regard to removal of the oxynitride anti-reflective coating. Either approach requires that a both a portion of the spacer layer and all of the anti-reflective coating be removed before the metal layer is deposited. However, the oxynitride anti-reflective coating is resistant to the etchants that are used to pattern the silicon oxide and silicon nitride spacers. This requires the spacer layer to be patterned during one etching step and the anti-reflective coating to be removed during another etching step. These two etching steps require two different etchants with different process conditions, and more than twice as much time. More importantly, the extra etching step will inevitably attack the exposed source/drain area since these area have been exposed during the first spacer etch process. This attack causes serious junction leakage, and serious junction recess (erosion). Therefore, what is also needed is a solution that reduces the number of etching steps, thereby enhancing production efficiency and minimizing Si (source/drain) area attack.

Heretofore, the requirements of HF resistance, high speed performance, production efficiency, and minimization of Si (source/drain) area attack have not been fully met. What is needed is a solution that simultaneously addresses all of these requirements.

SUMMARY OF THE INVENTION

Additional goals of the invention are: (1) to provide an HF resistant spacer; (2) to maintain the device's dynamic performance; (3) to improve production efficiency; and (4) to minimize the vulnerability of the source/drain junction to attack.

In accordance with these goals, there is a particular need for a self aligned silicide (salicide) MOSFET structure with tunable oxynitride spacers. The silicide is self aligned by the geometric extent of the oxynitride spacers. The spacers are made of the same material as the anti-reflective coating. Thus, it is rendered possible to simultaneously satisfy the above-discussed requirements of HF resistance, high speed performance, production efficiency, and minimizing Si (source/drain junction) area attack which, in the case of the prior art, are mutually contradicting and cannot be simultaneously satisfied.

A first aspect of the invention is implemented in an embodiment that is based on a salicided MOSFET structure, comprising: a source region; a first salicide portion adjacent said source region; a first oxynitride spacer connected to said first salicide portion; a polycrystalline silicon gate having a first side surface adjacent said first oxynitride spacer, a top surface, and a second side surface; a second salicide portion adjacent said top surface and connected to said first oxynitride spacer; a second oxynitride spacer adjacent said second to side surface and connected to said second salicide portion; a third salicide portion connected to said second oxynitride spacer; and a drain region adjacent said third salicide portion and connected to said second oxynitride spacer.

A second aspect of the invention is implemented in an embodiment that is based on a method of fabricating a salicided MOSFET structure, comprising: forming a coating on a gate layer, said coating including a first material; patterning said gate layer through said coating so as to define a gate, said coating remaining on a first portion of a surface of said gate; depositing a first layer on i) said coating, ii) a second portion of said surface of said gate, iii) a third portion of said surface of said gate, iv) a surface of a source region operably coupled to said gate, and v) a surface of a drain region operably coupled to said gate, said first layer including said first material; removing substantially all of said coating and a fraction of said first layer so as to expose said first portion of said surface of said gate, said surface of said source region, and said surface of said drain region, while forming a first spacer adjacent said second portion of said surface of said gate and a second spacer adjacent said third portion of said surface of said gate; cleaning said first portion of said surface of said gate, said surface of said source region, and said surface of said drain region; depositing a second layer on a) said first portion of said surface of said gate, b) said source region, and c) said drain region, said second layer including a salicide forming reactant; and converting a part of said second layer into a salicide by reacting said second layer with silicon in 1) said gate, 2) said source region, and 3) said drain region with said salicide forming reactant.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

DESCRIPTION OF PREFERRED EMBODIMENTS

Figure 1:
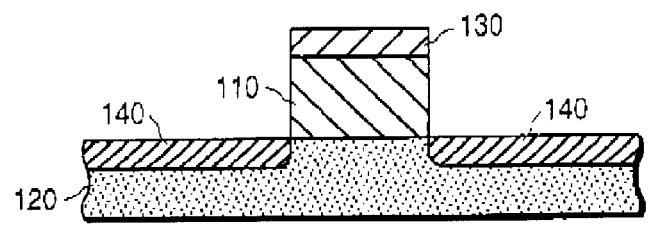
FIG. 1 illustrates a schematic view of an oxynitride anti-reflective coating on top of a polycrystalline silicon MOSFET gate, representing an embodiment of the invention.

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention is microelectronic fabrication, for example, in a PECVD chamber. More specifically, the invention can be advantageously utilized in the context of salicided MOSFETs, particularly where an anti-reflective coating is being deposited before gate formation. By using the same material for both the anti-reflective coating and the spacers, the anti-reflective coating can be removed and the spacers formed in a single etching step, thereby keeping the number of process steps to a minimum. By using an oxynitride material for both the anti-reflective coating and the spacers, the spacers are resistant to HF cleaning and have a preferred low fringing capacitance.

The invention includes a self-aligned silicided (salicided) MOSFET structure having spacers that are composed of the same material that is used as an anti-reflective coating during patterning of the gates. In preferred embodiments, this material includes oxynitride ($SiN_xO_y$).

If the spacers include oxynitride, the spacers can be tunable with regard to a number of material properties. The tuning is effected by selecting contents of [O], and [N] (x and y values). The properties that can be tuned include electrical, chemical, mechanical, and optical.

With regard to electrical properties, the dielectric constant of the spacers can be adjusted by selecting the X:Y ratio. It is advantageous that the dielectric constant of the spacers be lower than silicon nitride. Lowering the X:Y ratio lowers the dielectric constant due to the increased presence of oxygen.

With regard to chemical properties, the susceptibility of the spacers to erosion due to exposure to HF can be adjusted by selecting the ratio of X:Y. Increasing the amount of nitrogen in the oxynitride lowers the susceptibility of the spacers to HF erosion (i.e., a higher X:Y ratio increases the resistance of the spacers to attack by the HF).

With regard to optical properties, the refractive index can be adjusted by setting the X:Y ratio. Also, the extinction coefficient can be adjusted by varying the X:Y ratio.

With regard to mechanical properties, the amount of residual stress can be adjusted by altering the composition of the oxynitride. For example, reducing the amount of nitrogen in the oxynitride may reduce the amount of internal residual stress. Optimizing the stress is important for minimizing the device hot-carrier effects.

A general description of an oxynitride anti-reflective coating/spacer deposition process follows. This particular process uses plasma-enhanced chemical-vapor deposition techniques. The pressure can be from approximately 1 torr to approximately 10 torr. The temperature can be from approximately 330° C. to approximately 370° C. The plasma power can be quite low, for example, approximately 120 watts. A higher plasma power can be used to achieve a higher deposition rate. Although these settings can be kept roughly the same for the sake of film uniformity, they can be changed to tune the oxynitride characteristics.

The process for forming an oxynitride anti-reflective coating will now be described. A first step is stabilization of the gas flow and pressure. A second step includes deposition of the anti-reflective coating itself. A third step includes pumping out the residual gas. A fourth step includes stabilization of the gas-flow and pressure. A fifth step includes deposition of a thin oxide. A sixth step includes pumping out the residual gas.

The gases used for deposition of the anti-reflective coating include $SiH_4$ (silane), $N_2O$ (nitrous oxide) and He (helium). He is used as a carrier and gas distribution uniformity mechanism. For the oxynitride anti-reflective coating, the ratio of $SiH_4$ to $N_2O$ can be within the range of 20–80:60–270, preferably approximately 63:110. Adjusting these ratios will determine the optical, mechanical, electrical, and chemical characteristics of the oxynitride anti-reflective coating.

A process for forming an oxynitride spacer layer will now be described. A first step includes stabilization of the gas flow and pressure. A second step includes deposition of the spacer layer itself. The spacer layer can have a thickness of from approximately 1500 Å to approximately 2000 Å.

The gases used for deposition of the oxynitride spacer layer also include $SiH_4$, $N_2O$ and He which is again used as a carry-gas and gas distribution uniformity mechanism. For the oxynitride spacer layer deposition, the ratio $SiH_4$ to $N_2O$ can be within the range of 20–80:60–270, preferably approximately 63:110. Adjusting these ratios will determine the optical, mechanical, electrical, and chemical characteristics of the oxynitride spacer layer.

In addition, the invention includes deposition of an oxide. The oxide is a capping layer over the DUV anti-reflective coating (i.e., oxynitride anti-reflective coating), which in turn is deposited over the polycrystalline silicon. Thus, from top to bottom, the layers are photoresist, oxide, oxynitride, and polycrystalline silicon. The purpose of the capping layer is to prevent the DUV photoresist material from interacting with the oxynitride film. The gases used for deposition of the oxide also include $SiH_4$, $N_2O$ and He which is again used as a carry-gas and gas distribution uniformity mechanism. For the oxide deposition, the ratio of $SiH_4$ to $N_2O$ can be within the range of 10–40:100–400, preferably approximately 11:310. Adjusting these ratios will determine the optical, mechanical, electrical, and chemical characteristics of the oxide.

EXAMPLE

A specific embodiment of the invention will now be further described by the following, nonlimiting example which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

Referring to FIG. 1, a polycrystalline silicon gate 110 is formed on a silicon substrate 120. An anti-reflective coating 130 remains on top of the gate 110 after a deep ultra-violet photo lithographic patterning process. The anti-reflective coating 130 includes an oxynitride material and is approximately 300 Å in thickness. N–/P– doped regions 140 are formed in the substrate 120. The regions 140 are formed by an ion implantation step.

Referring now to FIG. 1, a spacer layer 210 is deposited on top of both the anti-reflective coating 130 and the substrate 120. The spacer layer 210 includes an oxynitride material and can coat those surfaces of the gate 110 that are not covered by the anti-reflective coating 130. The spacer layer 210 is approximately 1750 Å in thickness.

Figure 2:
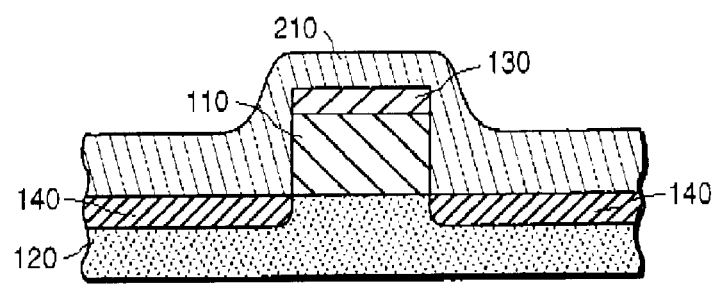
FIG. 2 illustrates a schematic view of depositing an oxynitride spacer layer on top of the structure depicted in FIG. 1, representing an embodiment of the invention.

Referring now to FIG. 2, a first spacer 310 and a second spacer 320 are formed by removing a portion of the spacer layer 210. The spacer layer 210 portion is removed by etching. The etching is stopped when the polycrystalline silicon of gate 110 is cleared of all of the anti-reflective coating 130. A pair of $N^+/P^+$ doped regions 330 are then formed in the substrate 120. The pair of $N^+/P^+$ doped regions 330 are formed by ion implantation.

Figure 3:
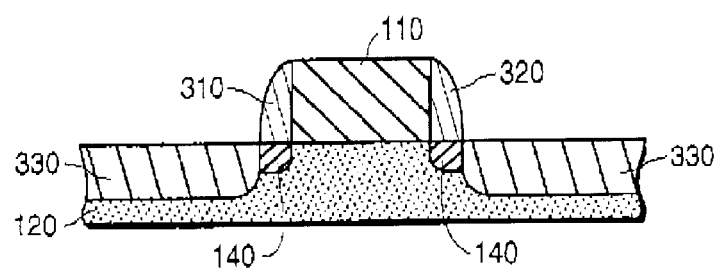
FIG. 3 illustrates a schematic view of forming a pair of oxynitride spacers from the oxynitride spacer layer deposited in FIG. 2, representing an embodiment of the invention.

Referring now to FIG. 3, a step of cleaning is then performed. The cleaning removes native oxide from the gate 110, the first spacer 310, the second spacer 320, and the regions 330. The cleaning is accomplished with the use of hydrofluoric acid (HF).

Figure 4:
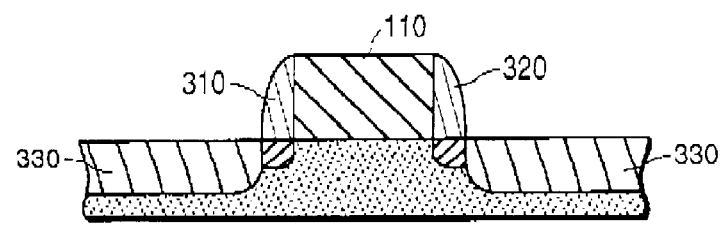
FIG. 4 illustrates a schematic view of removing native oxide from the structure depicted in FIG. 3, representing an embodiment of the invention.

Referring now to FIG. 4, a salicide precursor layer 510 is deposited over the cleaned surfaces. The salicide precursor structure 510 includes titanium and cobalt. Of course, other salicide forming precursor metals, for example nickel, can be used.

Figure 5:
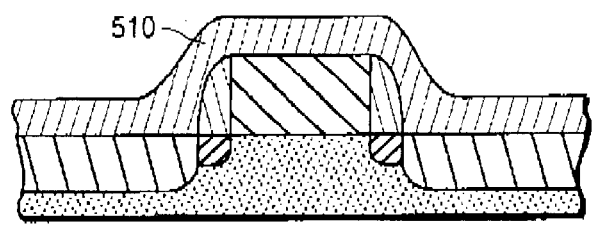
FIG. 5 illustrates a schematic view of depositing a metal layer on top of the structure depicted in FIG. 4, representing an embodiment of the invention.
Figure 6:
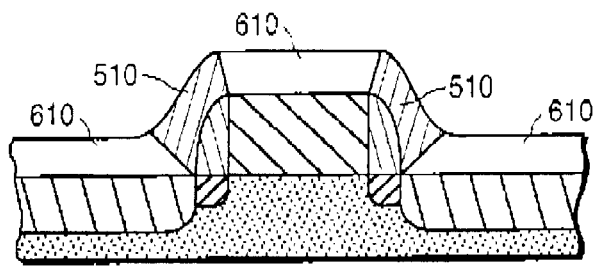
FIG. 6 illustrates a schematic view of annealing during which salicide is formed by reacting a portion of the metal layer deposited in FIG. 5, representing an embodiment of the invention.

Referring now to FIG. 5, salicide portions 610 are formed by reacting the salicide precursor layer 510 with the silicon in the substrate 120 and the polycrystalline silicon gate 110. The reaction is driven by rapid thermal annealing. The portion of the salicide precursor layer 510 adjacent the first spacer 310 and the second spacer 320 is substantially not transformed by the self aligned silicide reaction. This is how the silicide become self aligned with the gate and source/drain.

Advantages of the Invention

A salicided MOSFET structure with tunable oxynitride spacer, representing an embodiment of the invention, can be cost effective and advantageous for at least the following reasons. The use of oxynitride as both a spacer material and an anti-reflective coating on top of the polysilicon gates permits the anti-reflective coating to be easily etched off during the spacer-formation step without the need for any additional anti-reflective coating removal step(s). This reduced junction leakage and recess (errosion). The oxynitride spacer has better HF etch resistance than a conventional silicon oxide (SiO) spacer. The oxynitride spacer has lower fringing capacitance than a conventional silicon nitride (SiN) spacer.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the salicided MOSFET structure described herein can be a physically separate module, it will be manifest that the salicided MOSFET structure may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method of fabricating a salicided MOSFET structure comprising:

forming an anti-reflective coating on a gate layer, said anti-reflective coating including oxynitride;

patterning said gate layer and said anti-reflective coating so as to define a gate having a top surface, and so as to define a remaining portion of said anti-reffective coating, said remaining portion of said anti-reflective coating overlying said top surface of said gate;

depositing a first layer such that said first layer overlies said remaining portion of said anti-reflective coating, said-first layer including oxynitride; and performing a single etch step to remove portions of said first layer so as to form a first spacer and a second spacer, said single etch step also removing all of said remaining portion of said anti-reflective coating.

2. The method of claim 1, wherein said anti-reflective coating comprises $SiN_xO_y$ and wherein the material properties of said anti-reflective coating are tuned by adjusting the x to y ratio.

3. The method of claim 2, wherein said first layer has a thickness of from approximately 1500 Å to approximately 2000 Å.

4. The method of claim 1, wherein said first layer comprises $SiN_xO_y$ and wherein the material properties of said first layer are turned by adjusting the x to y ratio.

5. The method of claim 1, further comprising:

depositing a salicide-forming reactant above said gate.

6. The method of claim 5, wherein said salicide forming reactant includes at least one member selected from the group consisting of Ti, Co, and Ni.

7. The method of claim 5, further comprising:

forming a salicide MOSFET structure by reacting said gate with said salicide forming reactant.

8. The method of claim 7, wherein reacting includes rapid thermal annealing.

9. A method for fabricating a MOSFET structure comprising:

providing an oxynitride coating on an upper surface of a gate above a substrate;

forming implanted regions of dopant in said substrate;

dispositing a first layer above said gate, said first layer comprising oxynitride;

performing a single etch step so as to remove all of said oxynitride coating on said gate and so as to modify said first layer to form spacers adjacent said gate;

depositing a salicide-forming reactant above said gate; and forming a salicide MOSFET by reacting said gate with said salicide-forming reactant.

10. The method of claim 9, wherein said oxynitride coating comprises $SiN_xO_y$ and wherein the material properties of said oxynitride coating are tuned by adjusting the x to y ratio.

11. The method of claim 9, wherein said first layer comprises $SiN_xO_y$ and wherein the material properties of said first layer are tuned by adjusting the x to y ratio.

12. The method of claim 9, wherein said salicide-forming reactant includes at least one member selected from the group consisting of Ti, Co, and Ni.

13. The method of claim 9, wherein reacting includes rapid thermal annealing.

14. A method of fabricating a MOSFET structure comprising:

forming a coating on a gate layer, said coating including a first material that comprises oxynitride;

patterning said gate layer and said coating to define a gate having a top surface, a portion of said coating remaining on said top surface of said gate;

depositing a first layer on said gate, said first layer containing said oxynitride; and performing a single etch step to remove all of said remaining portion of said coating during a time in which said first layer is modified to form a first spacer and a second spacer adjacent said gate.

15. The method of claim 14, wherein a salicide-forming reactant is deposigted above said gate and a salicide MOSFET is formed by reacting said salicide-forming reactant with a source region and a drain region.

16. The method of claim 15, wherein a salicide region is located above said source region and said drain region, said salicide region being contiguous with a lower portion of at least one of said first spacer and said second spacer.

17. The method of claim 14, wherein said first material comprises $SiN_xO_y$ and wherein the material properties of said first material are tuned by adjusting the x to y ratio.

18. A method of fabricating a MOSFET structure comprising:

forming an oxynitride anti-reflective coating on a gate layer;

patterning said gate layer and said oxynitride anti-reflective coating to define a gate having a top surfaced, wherein a portion of said oxynitride anti-reflective coating remains on said top surface of said gate;

depositing a layer of oxynitride over said portion of said oxynitride anti-reflective coating remains on said top surface of said gate; and performing a single etch step to remove all of said portion of said oxynitride anti-reflective coating remaining on said top surface of said gate during a time in which said layer of oxynitride is modified to form a first spacer and a second spacer adjacent said gate.

19. The method of claim 18, wherein a salicide-forming reactant is disposed above said gate and a salicide MOSFET is formed by reacting said salicide-forming reactant with a source region and a drain region.

20. The method of claim 19, wherein a salicide region is located above said source region and said drain region, said salicide region being contiguous with a lower portion of at least one of said first spacer and said second spacer.

21. The method of claim 1, wherein said oxynitride anti-reflective coating comprises $SiN_xO_y$ and wherein the material properties of said oxynifride anti-reflective coating are tuned by adjusting the x to y ratio.

* * * * *

UNITED STATES PATENT AND TRADEMARK OFFICE
CERTIFICATE OF CORRECTION

PATENT NO. : 6,806,154 B1
DATED : October 19, 2004
INVENTOR(S) : Quo-Quiang Patrick Lo It is certified that error appears in the above-identified patent and that said Letters Patent is hereby corrected as shown below:

Column 1,
Line 40, "from a salicede" should read -- form a salicide --.
Line 49, "in to more" should read -- In more --.

Column 2,
Line 26, before the word "Additional" insert the sentence -- A primary goal of the invention is to provide a robust MOSFET structure that can be integrated into a typical salicide process. --.
Line 52, "to side" should read -- side --.

Column 5,
Line 66, "3" should read -- 4 --.

Column 6,
Line 4, "4" should read -- 5 --.
Line 9, "5" should read -- 6 --.
Line 16, "become" should read -- becomes --.

Column 7,
Line 4, "gale" should read -- gate --.
Line 8, "anti-reffective" should read -- anti-reflective --.
Line 13, "said-first" should read -- said first --.
Line 28, "turned" should read -- tuned --.
Line 44, "dispositing" should read -- depositing --.

UNITED STATES PATENT AND TRADEMARK OFFICE
CERTIFICATE OF CORRECTION

PATENT NO. : 6,806,154 B1
DATED : October 19, 2004
INVENTOR(S) : Quo-Quiang Patrick Lo It is certified that error appears in the above-identified patent and that said Letters Patent is hereby corrected as shown below:

<u>Column 8,</u>
Line 21, "deposigted" should read -- deposited --.
Line 48, "disposed" should read -- deposited --.
Line 57, "oxynifride" should read -- oxynitride --.

Signed and Sealed this

Fifteenth Day of February, 2005

JON W. DUDAS
*Director of the United States Patent and Trademark Office*